United States Patent [19]

Hansen

[11] 4,251,776
[45] Feb. 17, 1981

[54] ARRANGEMENT FOR RAISING A SIGNAL TO A HIGHER POWER

[75] Inventor: Henning M. Hansen, Nordborg, Denmark

[73] Assignee: Danfoss A/S, Nordborg, Denmark

[21] Appl. No.: 12,220

[22] Filed: Feb. 15, 1979

[30] Foreign Application Priority Data

Feb. 16, 1978 [DE] Fed. Rep. of Germany ....... 2806596

[51] Int. Cl.³ .................. G06G 7/20; H03K 17/00
[52] U.S. Cl. .................... 328/144; 307/229; 328/158; 328/160
[58] Field of Search .............. 328/144, 145, 158, 160; 307/229, 230

[56] References Cited

U.S. PATENT DOCUMENTS 3,113,274  12/1963  Utt ........................................ 328/144
3,757,099   9/1973  Anderson ............................. 307/229
3,914,624  10/1975  Jackson ................................ 328/144

Primary Examiner—Stanley D. Miller, Jr.
Assistant Examiner—B. P. Davis
Attorney, Agent, or Firm—Wayne B. Easton

[57] ABSTRACT

The invention relates to an analog computing device for converting a signal x to a different power with a selectable exponent. First and second RC type time dependent transfer elements, having the functions $f_1$ and $f_2 = f_1^b$ are driven by a square wave generator. The output of the first transfer element is connected to the first input of a comparator and the second input of the comparator is supplied with the signal x of which the power is to be raised to the exponent b. An instantaneous value of the output signal of the second transfer element is scanned and held by a scanning and holding latch which is triggered by the output signal of the comparator which occurs when the signal x and the output signal of the first transfer element are equal.

4 Claims, 3 Drawing Figures

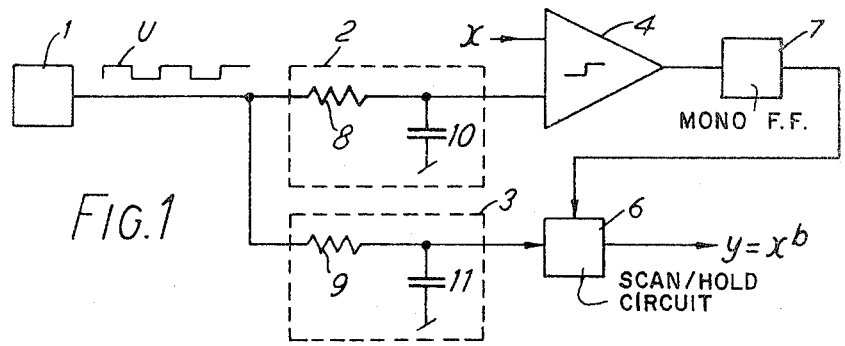
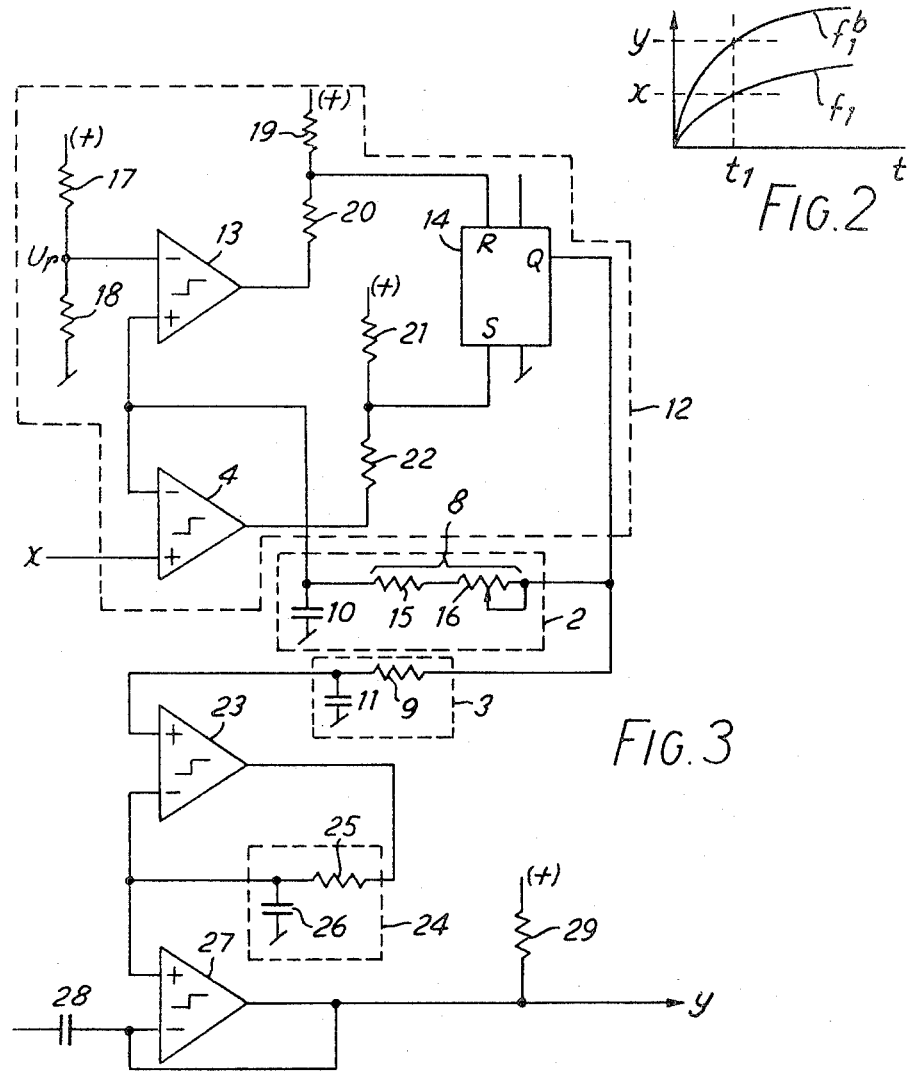

ARRANGEMENT FOR RAISING A SIGNAL TO A HIGHER POWER

The invention relates to an arrangement for raising a signal to a higher power with a selectable exponent.

Such an arrangement can be used for linearising the characteristic curve of a measuring appliance. Preferably, it is employed to linearise the characteristic curve of flow meters.

The invention is based on the problem of providing an arrangement for raising a signal to a higher power that has a comparatively simple construction.

According to the invention, this problem is solved in that a first transfer element with the time dependent transfer function $f_1$ and a second transfer element with the transfer function $f_2 = f_1^b$ are connected to a square wave generator, that the output of the first transfer element is connected to the first input of a comparator and the second input of the comparator can be supplied with the signal x of which the power is to be raised to the exponent b, and that the instantaneous value of the output signal of the second transfer element can be stored in response to the output signal of the comparator occurring when the signal x and the output signal of the first transfer element are equal.

By means of the square wave generator, both transfer elements are simultaneously acted upon by a signal jump so that, independent of the time course of the transfer functions $f_1$ and $f_2$ solely by reason of the fact that the transfer function $f_2$ of the second transfer element is always the $b^{th}$ power of the transfer function $f_1$ of the first transfer element, the output signal of the second transfer element is at every instant the $b^{th}$ power of the output signal of the first transfer element. Thus, if the output signal y of the second transfer element is scanned and held at the instant when the output signal of the first transfer element is equal to the signal x of which the power is to be raised, then the equation $y = x^b$ applies to the output signal of the second transfer element. The components for bringing these functions about can be of comparatively simple construction.

Thus, the transfer elements can be comparatively simply constructed if the transfer function are expontential functions.

To bring about these exponential functions one can use LR elements but transfer elements in the form of RC elements are simpler.

Preferably, it is ensured that the square wave generator comprises a bistable trigger element of which the setting input is connected to the output of the comparator, the resetting input is connected to the output of a second comparator and the output is connected to the inputs of the transfer elements, and that the first input of the second comparator is connected to the output of the first transfer element and the second input of the second comparator is connected to a reference voltage source. In this construction, the first comparator already forms part of the square wave generator so that it fulfils a duel function. Simultaneously, it is ensured that the period of the square wave generator automatically adapts itself to the time constants of the first transfer element when the latter is changed to alter the exponent b.

It is also favourable if the output of the second transfer element is connected to the first input of a third comparator of which the output is coupled back to the second input by way of a third transfer element with storage effect, the transfer function of the third transfer element having a smaller time constant than that of the second transfer element. In this construction, the output signal of the second transfer element is held in a simple manner at the time the output signal of the first comparator is changed.

Next, it can be ensured that the output of the third transfer element is connected to the first input of a directly countercoupled differential amplifier of which the second input is connected to earth by way of a condenser. This directly countercoupled differential amplifier ensures a transfer in the ratio 1:1 of the scanned value held in the storage element of the third transfer element with simultaneous impedance conversion for adaption to a subsequent indicating apparatus.

Another simple construction can be such that the output of the second transfer element is connected to the transfer input of a scanning and holding element and the output of the first comparator is connected to the scanning input of the scanning and holding element by way of a monostable trigger element.

In all cases, the comparators can be in the form of differential amplifiers with high amplification. These are very sensitive by responding to the slightest differences in their input signals and the sign of these differences by changing their output signals from one saturation value to the other. They are therefore particularly suitable for the comparison as well as for forming the square wave generator and the scanning and holding element.

Preferred examples will now be described in more detail with reference to the drawing, wherein:

FIG. 1 is a block diagram of a first embodiment according to the invention of an arrangement for raising to a higher power;

FIG. 2 is a time diagram to explain the function of the arrangement of FIG. 1, and FIG. 3 is a block diagram of a second embodiment according to the invention of an arrangement for raising to a higher power.

According to FIG. 1, the output of a square wave generator 1 is connected to the inputs of two transfer elements 2 and 3. The output of the first transfer element 2 is connected to the first (non-inverting input of a comparator 4 in the form of a differential amplifier with high amplification. The second (inverting) input of the comparator 4 is supplied with the signal x of which the power is to be raised. The output of the second transfer element 3 is connected to the transfer input of a scanning and holding element 6. A monostable trigger element 7 is disposed between the output of the comparator 4 and the scanning input of the scanning and holding element 6. The transfer element 2 is an integrating RC element with the time constant $T_1$ and the transfer element 3 is an integrating RC element with the time constant $T_2 = T_1/b$, wherein b is the exponent to which the power of the signal x is to be raised. The resistance R8 of the resistor 8 in the first transfer element 2 can be b times the resistance R9 of the resistor 9 whereas the capacitances C10 and C11 of the condensers 10 and 11 may be equal.

To explain the function of the FIG. 1 arrangement, reference is made to FIG. 2, it being assumed for simplicity that the transfer element 2 has the transfer function $f_1$ and the transfer element 3 has the transfer function $f_2 = f_1^b$.

When a positive signal jump is fed to the inputs of the transfer elements 2 and 3 by the square wave generator 1, the amplitude of the output signal of the transfer element 2 increases according to the transfer function $f_1$ whilst the output signal of the transfer element 3 increases according to the transfer function $f_1{}^b$. At the instant $t_1$, the output signal of the transfer element 2 reaches the value x. At the same instant $t_1$, the output signal y of the transfer element 3 then has the value $x^b$. When the output signal of the transfer element 2 has reached the value x, the output signal of the comparator 4 that was until then negative or zero changes its sign or its value. This change operates the monostable trigger element 7 to deliver a short pulse. This pulse gates the scanning and holding element 6 so that the value $y = x^b$ of the output signal of the transfer element 3 is scanned and held for display at the instant when the output signal of the transfer element 2 is equal to x.

However, since the transfer elements 2 and 3 are only simple RC elements, the relationship $f_2 = f_1{}^b$ between their output signals applies only in the case of the assumptions that will be considered in more detail hereinafter.

In a period between two positive voltage jumps at the inputs of the transfer elements 2 and 3, the output voltage $U_1$ of the transfer element 2 is given by $$U_1 = U \cdot e - (t/T_1) \tag{1}$$

and the output voltage $U_2$ of the second transfer element is given by $$U_2 = U \cdot e - (t/T_1) \tag{2}$$

with the time constants $$T_2 = (T_1/b) \tag{3}$$

and at the instant $t = t_1$, when the output voltage $U_1$ of the first transfer element 2 has dropped to x, $$U_1(t_1) = U \cdot e - (t_1/T_1) = x \tag{4}$$

and $$U_2(t_1) = U \cdot e - (t_{1b}/T_1) = y \tag{5}$$

Equations (4) and (5) give $$Y/U = (x/U)^b \tag{6}$$

and $$y = U^{(1-b)}{}_{19} x^b \tag{7}$$

which means that the output voltage $U_2(t) = y$ of the second transfer element 3 is, at the instant $t_1$ when the output voltage of the first transfer element 2 has reached the value x, basically not only proportional to a power of x but also proportional to a power of U, the maximum value of the output signal of the square wave generator 1. However, if one restricts to exponents b, which are considerably less than 1, the exponent of U is approximately equal to 1, resulting in the formula $$y \approx U \cdot x^b \tag{8}$$

wherein U merely represents a scale factor or calibration factor, thereby giving $$y \sim x^b \tag{9}$$

If one does not wish to restrict oneself to exponents b which are considerably less than 1, then a fresh calibration is necessary after each change of b, for example by approximately changing U, thereby giving $$U^{(1-b)} = \text{const} \tag{10}$$

For simple linearisation purposes, however, a once only setting of b will generally be sufficient.

Other conditions that must be fulfilled are that x must be less than U and only the time interval between two positive pulses of the square wave generator 1 should be utilised. The last-mentioned condition can be fulfilled in that the monostable trigger element 7 is designed so that it responds only to the change in the output signal of the comparator 4 opposite to that described above.

To set the desired exponent b, the time constants $t_1 = R8 \cdot C10$ and/or $T_2 = R9 \cdot C11$ may be adjustable.

In the embodiment of FIG. 3, the square wave generator 12 itself contains the comparator 4, a further comparator 13 and a bistable trigger element 14. The second (inverting) input of the first comparator 4 and the first (non-inverting) input of the second comparator 13 are connected to the output of the first transfer element 2 of which the resistor 8 consists of a fixed resistor 15 and an adjustable resistor 16, wherein $R15 = R9$ and $C10 = C11$. The second input of the second comparator 13 is disposed at the tapping of a voltage divider which forms a reference voltage source, consists of two resistors 17 and 18 and is so set that the reference voltage $U_r$ occurring at the tapping is directly (about 1%) below the operating voltage (+) corresponding to the FIG. 1 value of U and here amounting to 10 V, i.e. $U_r = 9.99$ Volt.

The output voltage of the comparator 13 is fed by way of a further voltage divider consisting of resistors 19 and 20 to the resetting input R, and the output voltage of the comparator is fed to the setting input S of the bistable trigger element 14 by way of a voltage divider consisting of resistors 21 and 22. The output Q of the bistable trigger element 14 is connected to the inputs of the transfer elements 2 and 3.

The output of the transfer element 3 is connected to the first input of a third comparator 23. The output thereof is connected by way of a third transfer element 24 in the form of an integrating RC element consisting of a resistor 25 and a condenser 26 to its second input and the first input of a fourth comparator 27. The output of the comparator 27 is directly connected to a second input, to earth by way of a condensor 28, and to the positive pole of the operating voltage by way of a resistor 29. At this output one then derives the output signal y. The resistance R25 is considerably smaller than the resistance R9 whilst the capacitances C10, C11, C26 and C28 are all equal.

The comparators are all differential amplifiers with high amplification (so-called operational amplifiers) in which even a very small voltage difference having one or the other sign at their inputs are sufficient for fully controlling into the one or other saturation range. When the potential at the first input (+) is higher than at the other (−), the output signal is positive, otherwise it is zero (or negative).

To explain the function, it is assumed that the bistable trigger element 14 is "set" so that its output signal is represented by the positive operative voltage of 10 Volt, its output resistance being comparatively low. The two condensers 10 and 11 are then charged simultaneously, although the condensor 10 charges more slowly than the condenser 11 because R8 is larger than R9. As soon as the voltage at the condenser 10 has reached the value $U_r=9.99$ Volt, the output signal of the comparator 13 changes from zero up to positive saturation. The trigger element 14 is thereby reset so that its output signal is zero. The condensers 10 and 11 now discharge through their drop resistor 8 and 9, respectively, but the condenser 11 more rapidly than the condenser 10, until the voltage at the condenser 10 has reached the value x, which may be set at a lower value than $U_r$. As soon as the voltage at the condenser 10 is slightly less than the value x, the output signal of the comparator 4 that had until then been zero goes into positive saturation so that the trigger element 14 is again set and the condensers 10 and 11 again become charged.

The value of the voltage applied to the condenser 11 at the instant of the last-mentioned change of the output signal of the comparator 4 is held by means of the comparator 23 and the transfer element 24. As long as the voltage at the condenser 11 drops, the voltage at the condenser 26 will also drop, namely at the same speed and to the same value. If the voltage at the condenser 11 or at the first input (+) of the comparator 23 falls below the value of the voltage at the condenser 26 or at the second input of the comparator 23, the output signal of the comparator 23 immediately changes to zero and the condenser 26 discharges more rapidly through the resistor 25 of low resistance than does the condenser 11, so that the output signal of the comparator 23 immediately becomes positive again. The condenser 26 will then be charged again very slowly by way of the resistor 25 and the comparatively high output resistance of the comparator 23. As a result, the condener 26 practically always retains the lower value of the voltage at the condenser 11. On the other hand, when the lowermost value of the voltage at the condenser 11 increases by reason of a change in x, the condenser 26 will in the end also hold this value as a new value, at least after one to two periods of the square wave generator 12. The value stored in the condenser 26 corresponds to the desired output signal y according to equation (7).

In principle, the comparator 27 and condenser 28 have the same function as the comparator 23 and the transfer element 24. The last stage 27, 28, 29 merely has the function of an impedance converter with the correction transfer value 1 by reason of the direct countercoupling of the comparator 27, so that the same signal y is obtained at the output of this comparator 27.

What is claimed is:

1. A circuit assembly for converting a signal x to a different power with a selectable exponent, comprising, first and second transfer means time dependent exponential transfer functions $f_1$ and $f_2$ respectively with $f_2=f_1^b$, a square wave generator connected to the inputs of said first and second transfer means, comparator means having first and second inputs with said first input connected to the output of said first transfer means and said second input connected to a source for said signal x, scanning and holding means connected to the output of said second transfer means for sampling an instantaneous level thereof, and trigger means connected to said comparator for gating said scanning and holding means to output said instantaneous level as an instantaneous value $x^b$.

2. A circuit assembly according to claim 1 wherein said transfer means include RC elements.

3. A circuit assembly according to claim 1 wherein said square wave generator includes a bistable trigger element with setting and resetting inputs and an output connected to said first and second transfer means, said comparator means being connected to said setting input, and second comparator means connected between said first transfer means and said resetting input.

4. A circuit assembly according to claim 3 wherein said scanning and holding means include third comparator means and third transfer means with storage characteristics, said third transfer means having a transfer function with a smaller time constant than that of said second transfer means.

* * * * *